United States Patent [19]

Kazuaki et al.

[11] Patent Number: 5,012,445

[45] Date of Patent: Apr. 30, 1991

[54] PROGRAMMABLE READ ONLY MEMORY BEING CAPABLE OF CONTROLLING INTERNAL WRITING VOLTAGE OF EXTERNAL VOLTAGE

[75] Inventors: Ujiie Kazuaki; Shinji Nabetani, both of Tokyo, Japan

[73] Assignees: Hitachi, Ltd.; Hitachi VLSI Engineering Co., both of Tokyo, Japan

[21] Appl. No.: 225,314

[22] Filed: Jul. 28, 1988

[30] Foreign Application Priority Data

Oct. 13, 1987 [JP] Japan .................................. 62-257877

[51] Int. Cl.[5] ....................... G11C 7/00; G11C 11/40; G11C 16/04; G11C 16/06

[52] U.S. Cl. .............................. 365/189.06; 365/226; 365/189.09; 307/296.5

[58] Field of Search ............... 365/189, 200, 201, 195, 365/243, 189.02, 189.03, 191, 189.05, 226, 189.06, 189.09; 307/296.5, 296.6

[56] References Cited

U.S. PATENT DOCUMENTS

| 4,145,760 | 3/1979 | Ward et al. ...................... 365/191 X |
| 4,148,099 | 4/1979 | Lauffer et al. ................... 365/191 X |
| 4,183,095 | 1/1980 | Ward ............................. 365/189.02 |
| 4,263,664 | 4/1981 | Owen et al. .................... 365/238.5 X |
| 4,393,481 | 7/1983 | Owen et al. ...................... 365/226 X |
| 4,424,582 | 1/1984 | Fukushima et al. ............. 365/189.03 |
| 4,543,647 | 9/1985 | Yoshida ............................... 365/201 |
| 4,553,225 | 11/1985 | Ohe ..................................... 365/201 |
| 4,612,630 | 9/1986 | Rosier .................................. 365/201 |
| 4,654,849 | 3/1987 | White, Jr. et al. ............... 365/201 X |
| 4,683,382 | 7/1987 | Sakurai et al. ................... 365/227 X |
| 4,727,514 | 2/1988 | Bhuva et al. ................. 365/189.03 X |
| 4,796,232 | 1/1989 | House ............................. 365/189.03 |
| 4,839,865 | 6/1989 | Sato et al. ........................ 365/226 X |
| 4,841,485 | 6/1989 | Prilik et al. ................. 365/189.03 X |

FOREIGN PATENT DOCUMENTS

| 60-85499 | 5/1985 | Japan . |
| 61-24094 | 1/1986 | Japan . |
| 61-269299 | 11/1986 | Japan . |
| 62-24499 | 2/1987 | Japan . |
| 62-33397 | 2/1987 | Japan . |
| 62-128100 | 6/1987 | Japan . |

Primary Examiner—Alyssa H. Bowler
Attorney, Agent, or Firm—Pennie & Edmonds

[57] ABSTRACT

A semiconductor integrated circuit device enabled to perform both a normal writing operation using a voltage elevated with the internal supply voltage taken as the reference voltage and a writing operation with the use of another voltage elevated with an external voltage applied to an external terminal taken as the reference voltage, whereby margin measurement, high-voltage test, and accelerated test are enabled to be performed even after packaging. Further, by providing the apparatus with a mode selector having a plurality of latch circuits operating at different timing connected to an input terminal so that modes are switched by changing combination of the signals latched in such latch circuits, the number of operating modes can be increased without increasing the number of pins.

24 Claims, 4 Drawing Sheets

PROGRAMMABLE READ ONLY MEMORY BEING CAPABLE OF CONTROLLING INTERNAL WRITING VOLTAGE OF EXTERNAL VOLTAGE

BACKGROUND OF THE INVENTION

The present invention relates to the art for semiconductor integrated circuit and the art specifically effective for use in a clamp system for elevated voltage and an input latch system. More particularly, the present invention relates to the art effective for use in a voltage elevating circuit and a mode setting circuit for EEPROM (electrically erasable programmable read-only memory).

In an electrically writable and erasable EEPROM device using nonvolatile storage elements such as MNOS (metal nitride oxide semiconductor), a voltage Vpp (for example, +15 V) higher than the voltage used when reading (+5 V) is required for writing and erasing data. Such a high voltage may be supplied from outside the chip, but recently there has been proposed an EEPROM being provided therein with a voltage elevating circuit using a charge pump and a voltage limiting circuit using a clamp diode and thereby adapted to be driven by a single power supply (Japanese Laid-open Patent Publication No. 61-24094). The purpose of this arrangement is to decrease the number of the external circuits and thereby to relieve users work load.

In an EEPROM apparatus, such tests are sometimes performed as measurement of the write voltage margin by weak writing, with a lower write voltage Vpp than usual, and a high-voltage test by strong writing, with a higher write voltage Vpp than usual, as well as an accelerated test by such strong writing to find permissible number of times of rewriting.

However, the EEPROM apparatus having the voltage elevating circuit provided within its chip as aforesaid has no Vpp terminal, and it is therefore impossible to apply a write voltage Vpp at a desired magnitude from outside. Hence, such tests by means of weak writing or strong writing are impracticable.

When the object of the testing is in the stage of a wafer, it can be managed to perform such tests by providing suitable pads on the chip and using probes. But, after the chip has been sealed in a package, it becomes impossible.

Generally, a 64k-bit EEPROM has 28 pins, of which the first and 26th pins are normally idle. Hence, there is proposed an EEPROM adapted to function in a test mode when a test control signal is input thereto using the idle pins. Such an art is disclosed, for example, in "Nikkei Electronics", published on Oct. 21, 1985, pp. 127–154.

In case of a 256k-bit EEPROM, however, since two pins are additionally required as address signal input pins, the generally provided 28 pins as they are not sufficient for establishing the test mode. Therefore, not only a test mode but also another operating mode becomes difficult to be added.

In order to set up a mode without increasing the number of pins but utilizing an existing control terminal, such an EEPROM is also proposed wherein the setting up of a test mode or the like is achieved by adapting the control terminal to be an input terminal for three levels.

When an input terminal for three levels is provided, however, it becomes difficult to set up two threshold values. Hence, there occur such problems that the threshold values varies according to processes and level setting of an external signal becomes troublesome.

In semiconductor memory, it has been in general practice to have operating modes established by combination of such signals as a chip enable signal $\overline{CE}$ and a write enable signal $\overline{WE}$. Also in an EEPROM, modes have been established by combination of a chip enable signal $\overline{CE}$, write enable signal $\overline{WE}$, and an output enable signal $\overline{OE}$.

When establishing these modes by the use of the three terminals as aforesaid, it may be possible to establish $2^3$ or 8 modes. In reality, however, when the chip enable signal $\overline{CE}$ is at HIGH level, the chip as a whole is put into a standby mode. Hence, all its combinations with other control signals become ineffective. Therefore, it follows that only five modes can be established including the standby mode. Since these modes are almost used up for necessary modes for the EEPROM such as a write mode, read mode, and a write inhibit mode, it has been difficult to add new test mode or the like without increasing the number of pins.

SUMMARY OF THE INVENTION

An object of the present invention is, in a nonvolatile memory having a voltage elevating circuit and a voltage limit circuit provided within the chip, to enable tests with a lower write voltage than usual and a higher write voltage than usual to be performed even after packaging so that reliability on the memory is improved.

Another, object of the present invention is to provide an input latch arrangement whereby the number of operating modes of a semiconductor integrated circuit can be increased without increasing the number of pins.

The above and other objects and novel features of the present invention will become more apparent from the description herein and the accompanying drawings.

Items representative of the inventions disclosed herein will be briefly described in the following.

In order to achieve the first object, a limit circuit for regulating an elevated voltage to be constant relative to a reference voltage is provided and two switches are connected to its terminal on the reference voltage supply side, with one switch connected with an internal power supply voltage terminal and the other switch connected with an external terminal of the chip.

In order to achieve the second object, a mode selector is provided by having a plurality of latch circuits operating at different timing connected to an input terminal so that modes are changed by different combinations of the signals latched in these latch circuits.

According to the aforesaid first measure, by selectively turning on one of the two switches provided for the limit circuit, it is enabled to perform both the normal writing wherein a voltage elevated with the internal supply voltage taken as the reference voltage is used and the writing wherein another voltage elevated with an external voltage applied to the external terminal taken as the reference voltage is used. Thus, the above mentioned object to enable such tests to be performed as margin measurement, high-voltage test, and accelerated test even after packaging and to thereby improve reliability on the EEPROM device can be achieved.

According to the aforesaid second measure, if n latch circuits are connected to one input terminal, $2^n$ signal combinations can be provided only by such an arrangement. By combining other input signals therewith or by having a plurality of latch circuits connected also to another input signal terminal, still more modes can be set up. Thus, the number of operating modes can be increased without increasing the number of pins.

DESCRIPTION OF THE PREFERRED EMBODIMENTS

Figure 1:
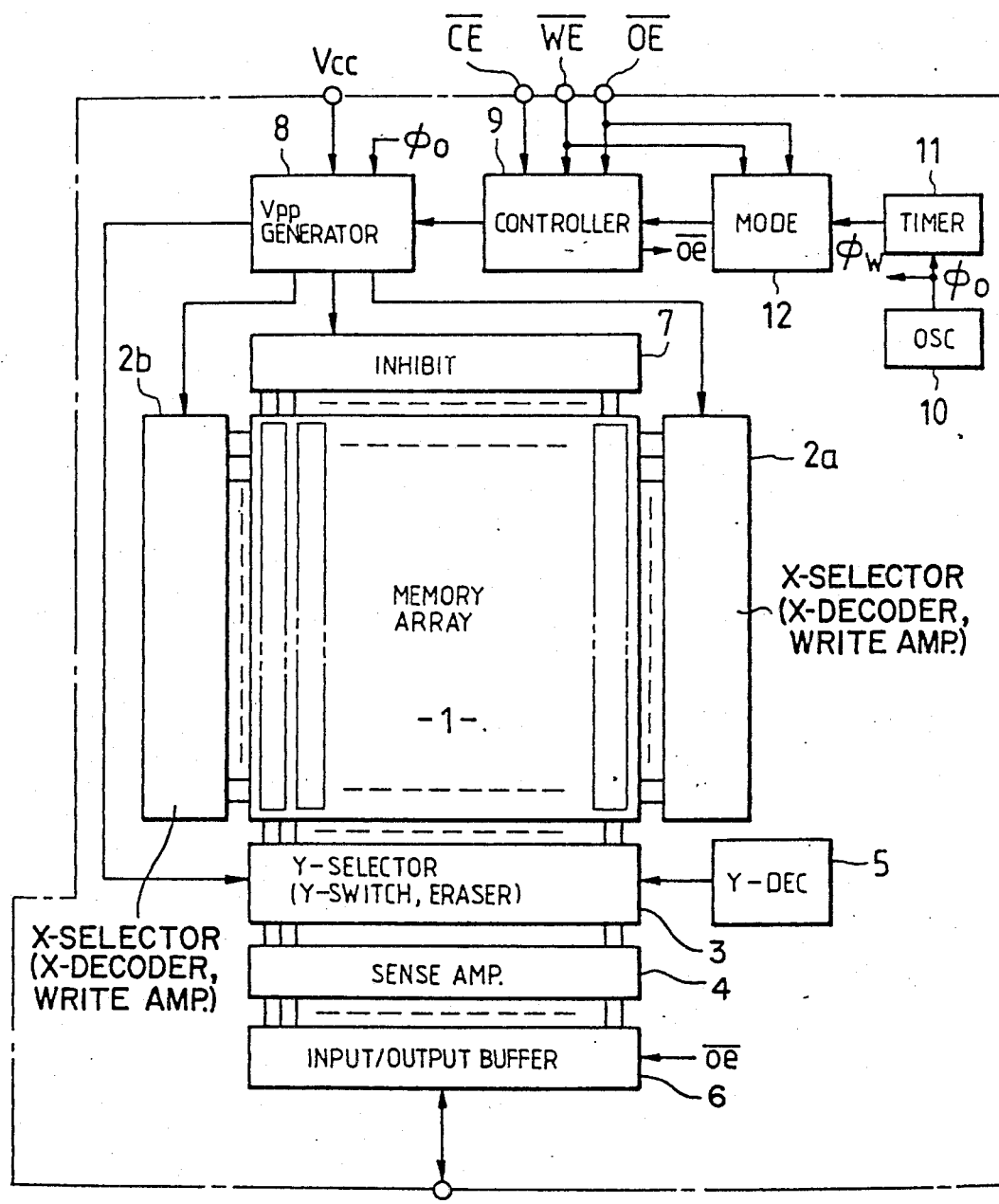
FIG. 1 is a block diagram of an EEPROM device to which the present invention is applied.

FIG. 1 is a block diagram schematically showing an overall structure of an EEPROM device to which the present invention is applied. In the figure, each circuit block encircled by a chain line is formed on a single semiconductor substrate by the known semiconductor circuit integration technique and small circles (o) therein indicate external terminals.

Figure 2:
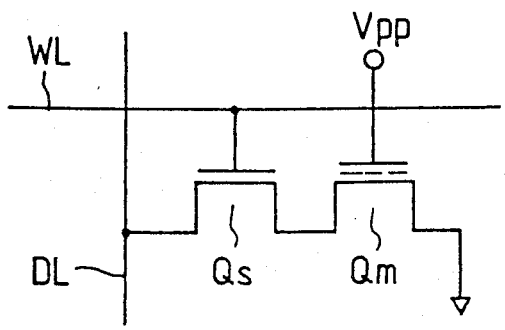
FIG. 2 is a circuit diagram showing an example of a memory cell arrangement of an EEPROM device.

Referring to the figure, reference numeral 1 denotes a memory array formed of a plurality, 256×256 bits, for example, of memory cells arranged in a matrix. Each memory cell as a constituent of the memory array 1 is, as shown in FIG. 2, structured of a selection switch MOSFET (insulated-gate field-effect transistor) Qs whose gate is connected to a word line WL and a nonvolatile storage element Qm formed of an MNOS connected between the source terminal of the selection switch MOSFET Qs and the ground point of the circuit. The drain terminal of the selection switch MOSFET Qs is connected with a data line DL.

Although not limitative, there are provided data latch circuits capable of latching the data on all the data lines at one side of the memory array 1. The group of memory cells in the same row connected to the same word line are formed in the same well region. Rewriting a byte as a unit is done in such a way that the data for one row are all read out, the data for the byte are rewritten on the data latch circuits, and all the data for one row are written together. By virtue of the provision of the data latch circuits, it is enabled to perform page reading, i.e., reading data for one row in succession.

On both sides of the memory array 1, there are disposed X-selectors 2a, 2b formed integrally of an X-decoder for selecting a word line out of 256 word lines according to an X-address signal, not shown, and a write circuit which at the time of writing applies as high voltage (write voltage) Vpp as +15 V to the gate electrode of the storage element (MNOS).

On the outside of the memory array 1 (at the lower side thereof in the figure), there is disposed, in parallel with the word line, a Y-selector 3 formed integrally of a row of column-switches (Y-switches) and erasers.

Adjoining the Y-selector 3, there are disposed sense amplifiers 4. The row of column switches in the Y-selector 3 are ON-OFF controlled according to a select signal from a Y-decoder 5 decoding a Y-address signal, not shown. At the time of reading, eight data lines are connected to the sense amplifiers 4 whereby eight bits of signals are simultaneously amplified. At the time of page reading, it is enabled to select eight bits from data for one row by the use of the data latch circuits and by only switching the Y-address signal. And, at the time of erasing data, the X-selector 2a, 2b and the erasers in the Y-selector 3 apply 0 V to the gate of the storage element Qm of the selected memory cell while applying the write voltage Vpp to the well region where the memory cell is formed.

The read out data amplified by the sense amplifiers 4 are output through an input/output buffer 6 to a data input/output terminal I/O. The output buffer in the input/output buffer 6 is structured of a tristate circuit, wherein a high-impedance output state is brought about when an internal output enable signal $\overline{oe}$ is brought to HIGH level and an output signal according to an output signal of the sense amplifier 4 is formed when the signal $\overline{oe}$ is brought to LOW level.

At the side (upper side in the figure) opposite to the side of the Y-selector 3, there are disposed write inhibit circuits 7 connected with each of the data lines of the memory array 1. The write inhibit circuits 7, at the time of writing data, apply high voltage at a level equal to the write voltage Vpp to the drain of each of the storage elements not to be written (requiring no charge injection) and thereby inhibit writing.

In a storage element such as the MNOS, if a high voltage (Vpp), such as 15 V, is applied to the gate electrode with the well region held at ground potential, charges based on tunneling effect are trapped by an interface between nitride layer and oxide layer under the gate electrode. However, if a high voltage equal to the write voltage (Vpp) is then impressed on the drain region of the MNOS, the charge injection by the tunneling effect does not occur. Thus, writing of data "1" or "0" is enabled.

Further, in the present embodiment, there is provided a write voltage generator 8 made up of a charge pump and a voltage clamper, an oscillator circuit 10 for generating a clock signal $\phi_0$ for operating the charge pump, and a controller 9 for generating an internal control signal (the aforesaid internal output enable signal $\overline{oe}$) for controlling the write voltage generator 8, X-selectors 2a, 2b, Y-selector 3, input/output buffers 6, etc. dependent on a plurality of external control signals such as a chip enable signal $\overline{CE}$, write enable signal $\overline{WE}$ and an output enable signal $\overline{OE}$. The write voltage generator 8, at the time of data writing and erasing, elevates the power supply voltage Vcc at +5 V to the write voltage Vpp and supplies the same to the write circuit in the X-selectors 2a, 2b, eraser in the Y-selector 3, and the write inhibit circuits 7.

Further, the EEPROM of the present embodiment is provided with a timer 11 for counting the clock $\phi_0$ generated in the oscillator circuit 10 thereby to form a control signal with a desired pulse width and a mode setting circuit 12 for determining the operating mode of the EEPROM dependent on the external control signals $\overline{CE}$, $\overline{WE}$, and $\overline{OE}$.

The control circuit 9 generates the internal control signal at predetermined timing based on the mode determined by the mode setting circuit 12.

Figure 3:
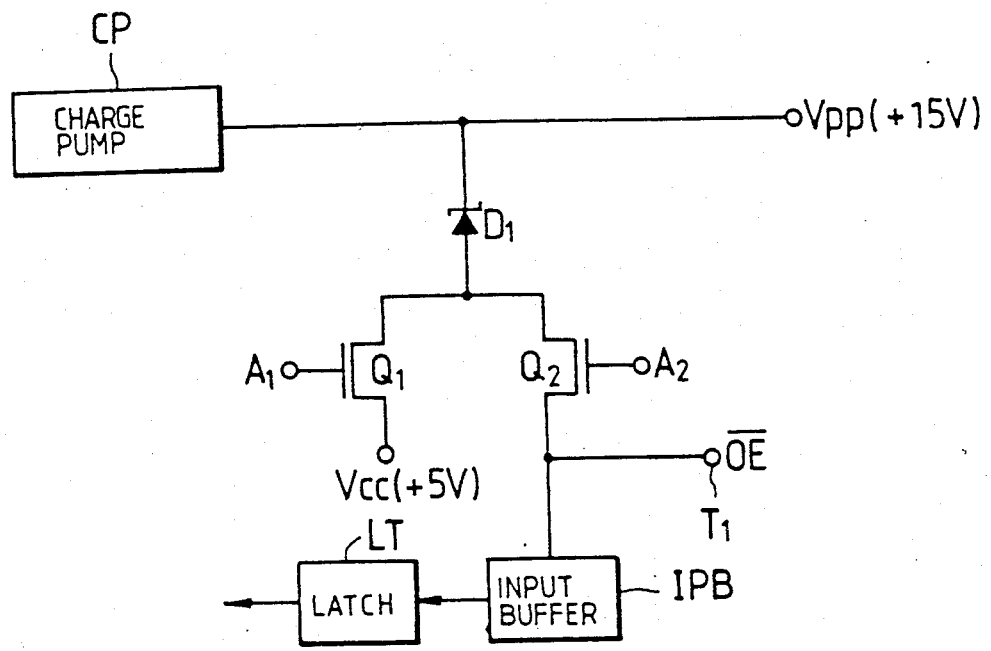
FIG. 3 is a circuit arrangement diagram showing an embodiment of a voltage elevating circuit for an NMOS memory.
Figure 4:
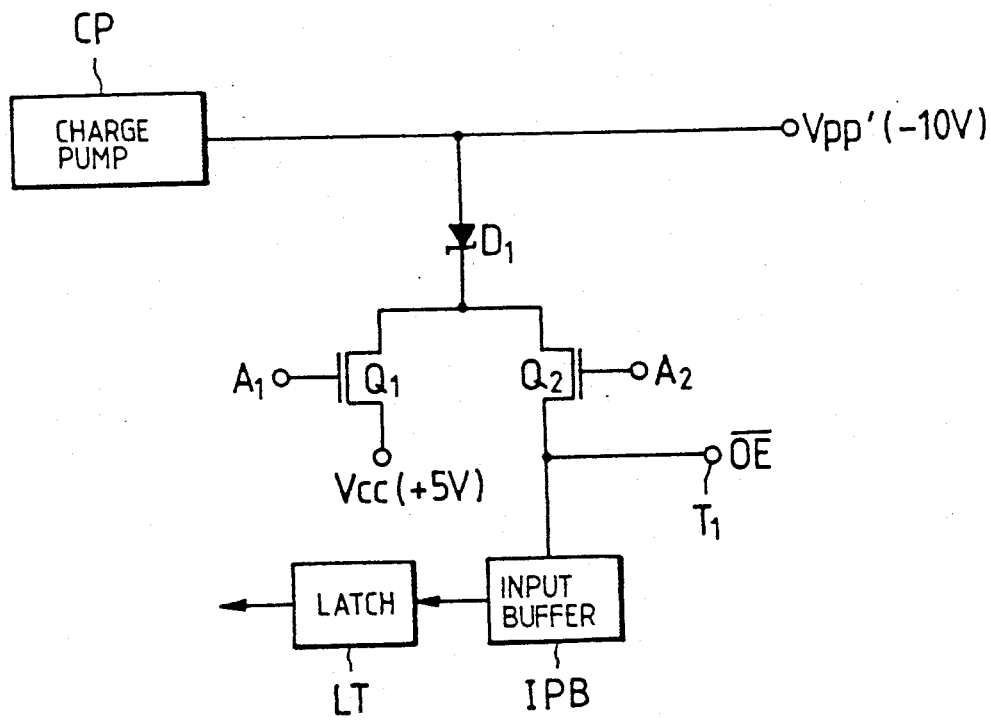
FIG. 4 is a circuit arrangement diagram showing an embodiment of a voltage elevating circuit for a CMOS memory.

FIG. 3 and FIG. 4 show examples of the write voltage generator 8. Of these, FIG. 3 shows a write voltage generator for an NMOS memory chiefly using N-channel MOSFET as the active element and FIG. 4 shows a write voltage generator for a CMOS memory using a complementary MOSFET.

In the case of the NMOS memory, even if a high voltage at +15 V is applied to the well region where the memory cell is formed, there is no problem since the substrate can be held at the same potential. In the case of the CMOS memory, however, if the power supply voltage Vcc (+5 V) is applied to the N-type substrate and the write voltage at +15 V is applied to the P well region, a forward bias is produced between the well and the substrate. Hence, in the write voltage generator for the CMOS memory of FIG. 4, it is adapted such that a write voltage Vpp' at −10 V is generated and writing and erasing data in the storage element is performed by the voltage difference (15 V) between the Vpp' and Vcc.

The write voltage generator of FIG. 3 is constituted of a charge pump circuit CP, which receives charges from the power supply voltage Vcc supplied from outside at +5 V, for example, and gradually elevates the level to generate as much higher voltage than the power supply voltage Vcc as 20–25 V, a clamp diode $D_1$, which controls the voltage generated by the charge pump CP and provides a constant write voltage Vpp at 15 V, for example, and switch MOSFETs $Q_1$, $Q_2$, each of which is connected with the cathode terminal of the clamp diode $D_1$.

Of these constituents, the MOSFET $Q_1$ is connected between the clamp diode $D_1$ and the power supply voltage Vcc and the MOSFET $Q_2$ is connected between the clamp diode $D_1$ and an external terminal $T_1$. When the MOSFET $Q_1$ is turned ON, the write voltage Vpp at 15 V higher than the voltage Vcc (5 V) by the voltage corresponding to the breakdown voltage of the clamp diode is produced, and when the MOSFET $Q_2$ is turned ON, a voltage higher than the voltage then impressed on the external terminal $T_1$ by the voltage corresponding to the breakdown voltage is produced.

Hence, if a voltage higher than the voltage Vcc is applied to the external terminal $T_1$ with the MOSFET $Q_2$ turned ON, a write voltage higher than 15 V is provided, and thereby, such tests as an accelerated test can be performed. And, if a voltage lower than the voltage Vcc is applied to the external terminal $T_1$ with the MOSFET $Q_2$ turned ON, it is enabled to perform margin measurement with a lower write voltage.

The breakdown voltage of the clamp diode $D_1$ in the write voltage generator of FIG. 3 is set to 10 V.

The write voltage generator for CMOS of FIG. 4, similarly to the circuit of FIG. 3, is constituted of a charge pump CP, clamp diode $D_1$, and switch MOSFETs $Q_1$, $Q_2$. This circuit is different from that of FIG. 3 in that the direction in which the clamp diode $D_1$ is connected is reverse to that in FIG. 3 and this circuit is adapted to generate a reduced write voltage VPP' of −10 V, for example. The reference voltage for the clamped voltage is the power supply voltage Vcc (5 V) or the voltage applied to the external terminal $T_1$ the same as that in the circuit of FIG. 3.

The breakdown voltage of the clamp diode $D_1$ of the write voltage generator in FIG. 4 is set to 15 V.

Such diodes as aforesaid having different breakdown voltages can be provided with accuracy by using Zener diodes, for example, and by suitably controlling the amount of ions shot into its semiconductor region.

In the above described embodiment, since a 64k EEPROM has idle pins, these can be used as the external terminal $T_1$ to which the reference voltage is supplied and the terminals to which control signals $A_1$, $A_2$ are input so as to be applied to the gates of the MOSFETs $Q_1$, $Q_2$ for turning the MOSFETs $Q_1$, $Q_2$ ON/OFF in an alternative way. However, a 256k EEPROM has no such idle pins.

To make the present embodiment to be also implemented to a 256k type, the input terminal of the output enable signal $\overline{OE}$ is adapted to serve also as the external terminal $T_1$ as will be described later in detail with reference to FIG. 5 and FIG. 6. To enable the terminal to be used for the two purposes, an input buffer IPB (not shown in FIG. 5) connected to the terminal $T_1$ is connected with latch circuits LTs (corresponding to latch circuits LT1, LT2 in FIG. 5) so that the output enable signal $\overline{OE}$ is latched by these latch circuits LTs. A reference voltage is thereby supplied to the terminal $T_1$ after a mode is determined so that a write voltage Vpp' different from that in the normal read mode is provided.

The control signals $A_1$, $A_2$ to be applied to the gate terminals of the MOSFETs $Q_1$, $Q_2$ are generated by the controller 9. The controller 9 is adapted to produce the control signals $A_1$, $A_2$, though not limitative, based on the chip enable signal $\overline{CE}$, output enable signal $\overline{OE}$, and the write enable signal $\overline{WE}$ from outside as well as an output signal of a mode selector MSC. By the control signals $A_1$, $A_2$, the switch MOSFETs $Q_1$, $Q_2$ are ON/OFF controlled in an alternative way.

Thus, at the time of data writing or erasing, a high level control signal $A_1$ from the controller 9 is supplied to the write voltage generator, the MOSFET $Q_1$ is turned ON with the MOSFET $Q_2$ turned OFF. Hence, as the output voltage of the charge pump CP exceeds the breakdown voltage (Vpp) of the diode $D_1$, current flows from the charge pump CP through the diode $D_1$ and the MOSFET $Q_1$. Thereby, the output voltage of the write voltage generator 8 is fixed to the breakdown voltage of the diode $D_1$, Vpp, and this voltage is supplied to the write circuit or the eraser in the X-selectors 2a, 2b and the Y-selector 3 and the write inhibit circuits 7. On the other hand, when a certain mode is selected by the mode selector MSC, the controller 9 in response thereto generates the control signal $A_1$ at LOW level and the control signal $A_2$ at HIGH level. Thereby, the writing operation at the high write voltage, or the writing operation at the low write voltage, as describe above, can be performed according to the voltage supplied to the external terminal ($\overline{OE}$).

Further, the present embodiment is provided with a chip mode, in which "1"s or "0"s are simultaneously written into all the memory cells, in addition to the read mode and program mode provided also for the conventional EEPROM, and these modes as well as the aforesaid test modes by strong writing and weak writing are adapted to be set up based on the three signals, the chip enable signal $\overline{CE}$, output enable signal $\overline{OE}$, and the write enable signal $\overline{WE}$.

Figure 5:
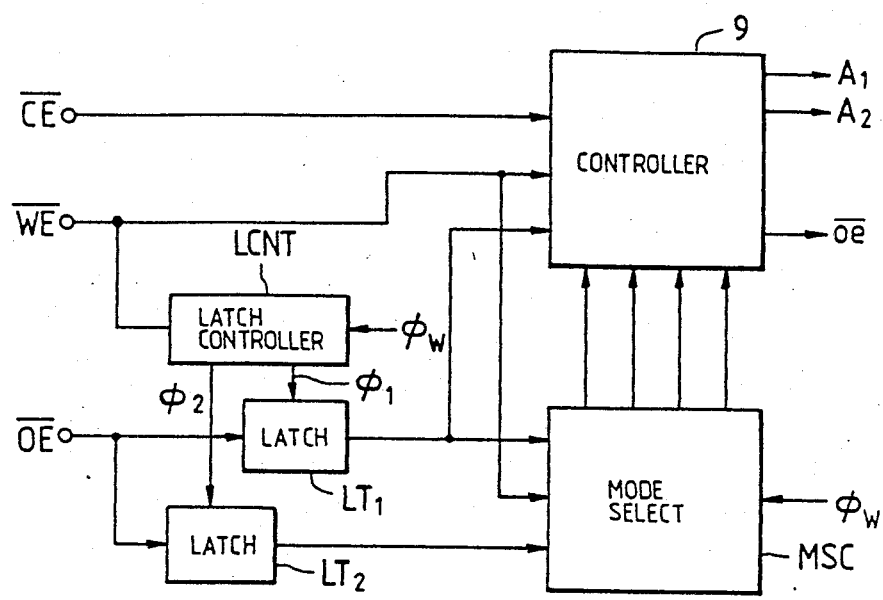
FIG. 5 is a block diagram showing an example of a circuit arrangement for determining the operating mode of a memory.

In order that six modes or more may be set up based on the three signals, the present embodiment is provided, as shown in FIG. 5, with a latch circuit $LT_1$ for latching the externally supplied output enable signal $\overline{OE}$ in synchronism with the fall of the external write enable signal $\overline{WE}$ and a latch circuit $LT_2$ for latching the external output enable signal $\overline{OE}$ in synchronism with the rise of the external write enable signal $\overline{WE}$. To avoid the figure from becoming complex, input buffer circuits for the signals $\overline{CE}$, $\overline{WE}$, and $\overline{OE}$ are not shown in the figure.

The above latch circuit $LT_1$, $LT_2$ normally allows the output enable signal $\overline{OE}$ to pass therethrough. Thereby, the controller 9, responding to the external output enable signal $\overline{OE}$, produces an internal output enable signal $\overline{oe}$ virtually in phase with the external signal. The latch circuits $LT_1$, $LT_2$ latch the signal state at the timing of the fall of the latch timing signals $\phi_1$, $\phi_2$, and maintain the latched signals while the timing signal is kept LOW, irrespective of the voltage (signal) state of the external terminal ($\overline{OE}$).

Connected with the input terminal of the write enable signal $\overline{WE}$, there is provided a latch controller LCNT for supplying the latch circuit $LT_1$ with the latch timing signal $\phi_1$ in synchronism with the fall of the signal $\overline{WE}$, for supplying the latch circuit $LT_2$ with the latch timing signal $\phi_2$ in synchronism with the rise of the signal $\overline{WE}$, and for controlling the signal $\phi_1$ so that the latch circuit $LT_1$ may keep on maintaining the data already latched therein even when the signal $\overline{WE}$ rises. The latch controller LCNT, after causing the latch timing signal $\phi_1$, $\phi_2$ to fall, brings back the latch timing signal $\phi_1$, $\phi_2$ to the HIGH level in synchronism with the write control signal $\phi_w$ output from the timer 11. The write control signal $\phi_w$ is the signal for providing enough time for rewriting data in each of the storage elements and adapted to have a pulse width of 10 mS in the embodiment. The timer 11 causes the write control signal $\phi_w$ to go HIGH in synchronism with the fall of the write enable signal $\overline{WE}$ and causes the same to go LOW after counting 10 mS.

During the first half 5 mS of the write control signal $\phi_w$, the charges are drawn from the storage element and the erasing is performed, and during the second half 5 mS, the writing is performed.

Meanwhile, the signals latched into the latch circuit $LT_1$, $LT_2$ are supplied to the mode selector MSC for determination therein of the operating mode. Dependent on the mode signal, the controller 9 generates a corresponding internal control signal and supplies it to each circuit. The mode selector MSC is rendered operative, though not limitative, when the write enable signal $\overline{WE}$ falls from HIGH level to LOW level, and thereafter, rendered inoperative when the control signal $\phi_w$ falls from HIGH level to LOW level. Thereby, the mode selector MSC produces the control signal dependent on the mode signals latched into, at the falls of the timing signals $\phi_1$, $\phi_2$, and maintained by the latch circuits $LT_1$, $LT_2$ and supplies the control signal to the controller 9.

Figure 6:
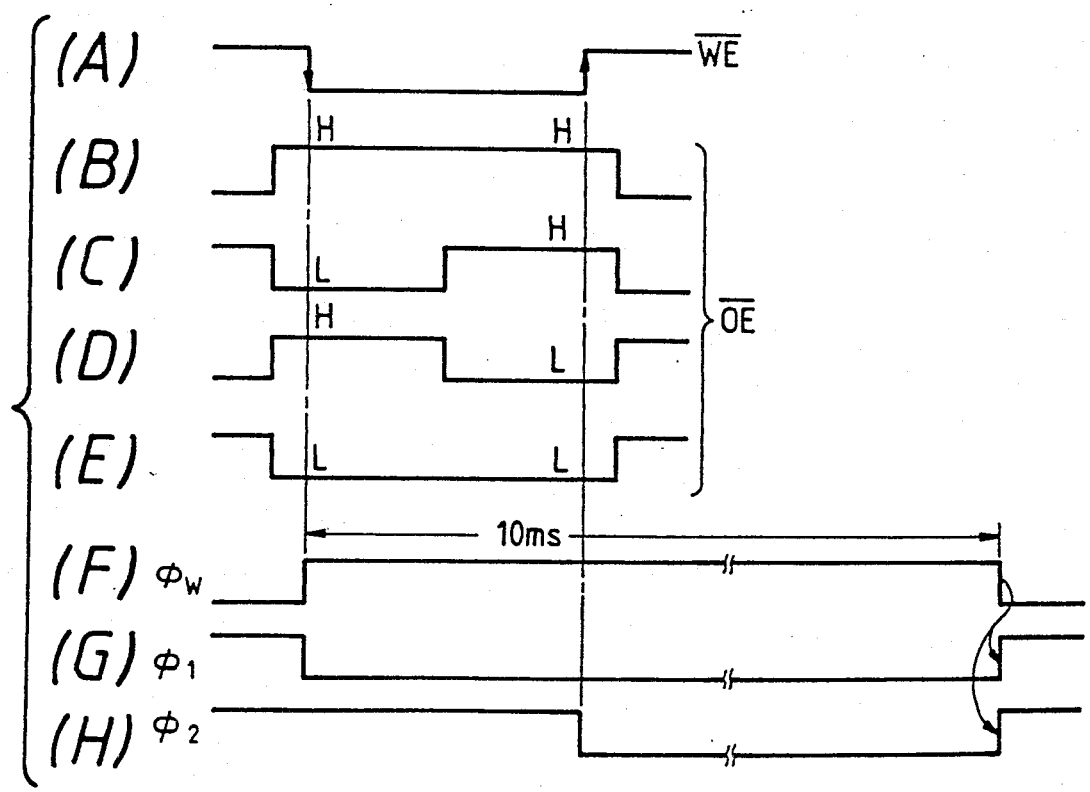
FIGS. 6a–6h are timing charts for showing latch timing in the mode determining circuit.

Thus, in the circuit according to the present embodiment, by varying the output enable signal $\overline{OE}$ as shown in FIG. 6 (B) to (E) and latching the varied signals $\overline{WE}$ at the timing of the fall and rise of the signal $\overline{WE}$ as shown in FIG. 6 (A), four combinations are obtained of the signals $\overline{OE}$ latched into the latch circuits $LT_1$, $LT_2$. Hence, by using these four combinations of the signals $\overline{OE}$ and the chip enable signal $\overline{CE}$ as well as the write enable signal $\overline{WE}$, seven modes including the stand-by mode can be set up.

An example of the modes to be set up are shown in Table 1.

| Mode | $\overline{CE}$ | $\overline{WE}$ | $\overline{OE}$ | |
|---|---|---|---|---|
| Standby | H | X | X | X |
| Read | L | H | L | |
| Re-select | L | H | H | |
| Write | L | L | H | H |
| Write Inhibit | L | L | L | L |
| Test 1 | L | L | L | H |
| Test 2 | L | L | H | L |

The "Standby Mode" in Table 1 is a mode in which the EEPROM chip with the power supply voltage applied thereto is not operating as yet but ready for operation upon receipt of a control signal. To minimize the power consumption in this state, idling current is prevented from being drawn by the circuit by breaking, with the chip select signal, the switches inserted between the power supply and the input buffers for the signal $\overline{WE}$, signal $\overline{CE}$, and so on.

The "Test 1" mode in Table 1 is a mode to achieve the operation proposed in the present invention to perform the test with the write voltage Vpp different from the normal voltage. Therefore, when the "Test 1" mode is established, the controller 9 produces the control signal $A_1$ at LOW level and the control signal $A_2$ at HIGH level.

Incidentally, the "Test 2" mode is a chip mode to write "1"s or "0"s simultaneously into all the memory cells. With all the data lines provided with their respective data latches in the embodiment as described above, the writing into all the memory cells is easily performed by once storing data in all the data latches and then bringing all the word lines to the write level by means of the X-selector.

The "Reselect" mode in Table 1 is a mode in which the chip is in a chip select state and the output is provided with a high impedance. By the use of this mode, the output timing can be controlled only by the output enable signal $\overline{OE}$ with the chip enable signal $\overline{CE}$ held LOW.

More particularly, X- and Y-address signals are provided while the output enable signal $\overline{OE}$ is at HIGH level and data are read into the sense amplifiers whereby the data read out can be output to the outside upon going to LOW level of the signal $\overline{OE}$. Thus, the apparent speed of the EEPROM apparatus can be increased.

The "Write Inhibit" mode in Table 1 is a mode provided for ensuring no erroneous writing to be made at the time the power is turned on by adapting the power supply to be turned on after previously fixing all the input terminals for the signals $\overline{CE}$, $\overline{WE}$, and $\overline{OE}$ to LOW level.

Incidentally, Table 1 shows just an example of modes, which of course are not limitative.

Further, the number of the latch circuits connected to the output enable terminal are not limited to two, but it is possible to arrange three or more of them to be connected thereto so that more modes can be selected.

Further, the terminal to which the latch circuits are connected is not limited to the output enable terminal, but an input terminal of another control signal such as a chip enable or a write enable signal or another terminal than that for a control signal can be used for the purpose. Furthermore, latch circuits can also be provided for the chip enable signal $\overline{CE}$, write enable signal $\overline{WE}$, and the address input terminal, whereby each signal can be latched therein at suitable timing, so that the load on the external circuits at the time of rewriting the memory is lightened and the efficiency of the CPU is enhanced.

Figure 7:
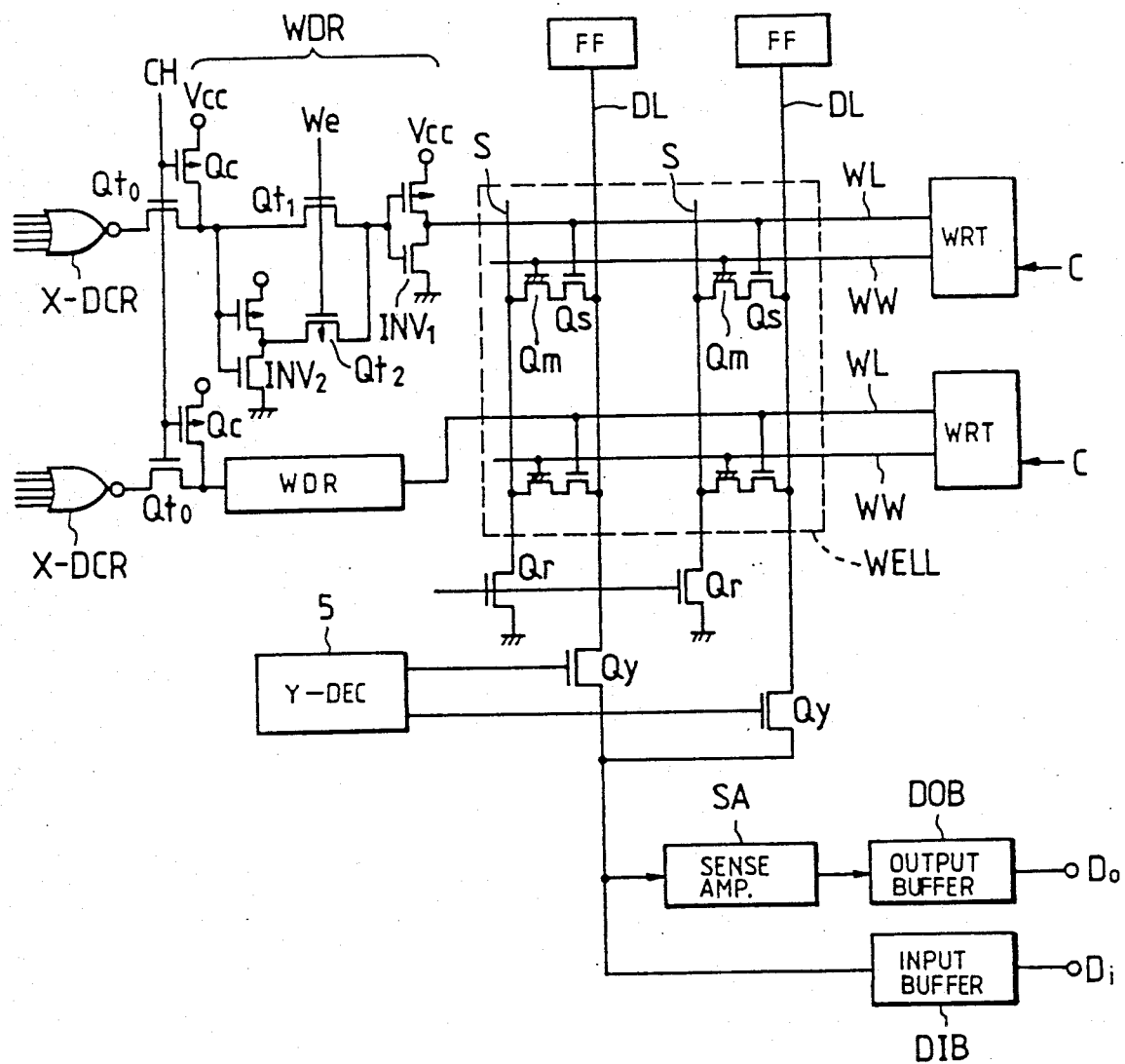
FIG. 7 is a circuit diagram showing a concrete example of a circuit arrangement of the EEPROM memory array and its peripheral portion to which the present invention is applied.

Now, a concrete example of the circuit enabling the chip mode for simultaneously writing "1" or "0" into all the memory cells mentioned in the description of the above embodiment will be described below with reference to FIG. 7.

Referring to the figure, WRT denotes a write circuit, which is rendered operative by a control signal C supplied by the controller 9. This circuit, at the time of writing, applies the voltage $-Vpp$ to the word line for writing WW of the unselected memory row and applies the voltage Vcc to the word line for writing WW of the selected memory row. At this time, the well region WELL wherein the memory cells are formed is supplied with the negative write voltage $-Vpp$. Hence, the potential difference $Vcc-Vpp$ is provided between the gate and well of the storage element Qm in the selected memory row so that writing is made therein, while the potential difference between the gate and well of the storage element Qm in the unselected memory row is held at 0 V so that writing is not made therein.

On the other hand, denoted by WDR is a word driver. At the time of writing, the word driver WDR, upon receipt of a decode signal from a unit X decoder X-DCR, brings the word line WL of the selected memory row to LOW level (GND) and brings the word line WL of the unselected memory row to HIGH level (Vcc). In the read mode, the word driver WDR brings the selected word line to HIGH level and brings the unselected word line to LOW level.

Even if the selected word line WL is brought to LOW level at the time of writing, the MOSFET Qs for selection is in an ON state since the well potential is $-Vpp$.

Between the X-decoder X-DCR and the word driver WDR is connected a transfer MOS $Qt_0$. The word driver WDR has two driving inverters, $INV_1$ and $INV_2$. There are provided a transfer MOS $Qt_1$ between the transfer MOS $Qt_0$ and the inverter $INV_1$ and a transfer MOS $Qt_2$ between the inverters $INV_1$ and $INV_2$. Since these MOS $Qt_1$ and MOS $Qt_2$ are complementarily turned ON/OFF according to a write control signal we supplied by the controller 9, the level of selection of the word line can be reversed between the read mode and the write mode as described above.

Further, between the input terminal of each word driver WDR and the supply voltage terminal Vcc, there is connected a MOSFET Qc which is complementarily turned ON/OFF with the transfer MOSFET $Qt_0$ according to a control signal CH, whereby, at the time of normal operation when the control signal CH is held HIGH, the MOSFETs Qc are all turned OFF and $Qt_0$ turned ON, and the signal from the X-decoder is input. And, upon establishment of the chip mode for simultaneously writing "1" or "0" into all the memory cells, the control signal CH supplied by the controller 9 goes LOW. Thereby, the MOSFET Qc are all turned ON and the input signals to all the word drivers WDR are fixed to HIGH level (Vcc), and hence outputs of the inverters $INV_1$ become LOW. Thus, all the word lines are brought to LOW level enabling the simultaneous writing into all the memory cells.

In the read mode, a switch MOSFET Qr for a common source line S to which the storage elements Qm for each column are connected is turned ON, and dependent on the writable condition of the storage element (magnitude of Vth), a current may or may not flow from the data line DL to the common source line S.

Thereby, the level of the data line changes and this change is amplified by the sense amplifier SA and the data read out is output by the output buffer DOB to the output pin $D_0$.

At the time of writing data, the data to be written input from the input pin Di to the input buffer DIB is sent onto a data line DL through a column switch $Q_y$ selectively turned ON, once latched into the data latch FF, and then written into a memory cell in the selected state.

Effects obtained from the above described embodiment are as follows:

(1) Providing a limit circuit for regulating an elevated voltage to be constant relative to a reference voltage, two switches are connected to its terminal on the reference voltage supply side, with one switch connected with an internal power supply voltage terminal and the other switch connected with an external terminal of the chip. Thus, by selectively turning ON one of the two switches provided for the limit circuit, it is enabled to perform both the normal writing wherein a voltage with the internal supply voltage taken as the reference voltage is used and the writing wherein another voltage elevated with an external voltage applied to the external terminal taken as the reference voltage is used. Through such functioning, even after packaging, margin measurement, pressure proof test, and accelerated test can be performed and reliability on the EEPROM apparatus can thereby be improved.

(2) A mode selector is provided by having a plurality of latch circuits operating at different timing connected to an input terminal so that modes are changed by different combinations of the signals latched in the latch circuits. Hence, if n latch circuits are connected to one input terminal, $2^n$ signal combinations can be provided even by such an arrangement. By combining other input signals therewith or by having a plurality of latch circuits connected also to another input signal terminal, still more modes can be set up. Through such functioning, the number of operating modes can be increased without increasing the number of pins.

While the invention made by the present inventor has been described above in a concrete manner based on a preferred embodiment, the present invention is not limited to the above described embodiment but various changes and modifications may be made therein without departing from the spirit and scope of the present invention. For example, although a charge pump was used for the voltage elevating circuit and a clamp diode was used for the limit circuit, other circuits than those may be used. Further, the clamp diode may be a part to be externally connected to the apparatus.

Although the invention made by the present inventor was described above as to its use applied to an EEPROM apparatus which had been the field of utilization provided a background for the present invention, the use of the present invention is not limited to it. It can be used for general semiconductor integrated circuits having a voltage elevating circuit and a limit circuit and also for general semiconductor integrated circuits, inclusive of such semiconductor memory devices as an ultraviolet erasable EPROM, static RAM, and a dynamic RAM, for which provision of a plurality of operating mode is desired while the number of pins thereof is limited.

What is claimed is:

1. A semiconductor integrated circuit device, including a nonvolatile storage element for storing information, said storage element having a first electrode for receiving a first predetermined voltage and a second electrode for receiving a second voltage, comprising:
   internal voltage generating means for generating an internal voltage;
   voltage limiting means comprising a zener diode coupled between an internal reference voltage node and said internal voltage generating means, said voltage limiting means limiting said internal voltage on the basis of a reference voltage applied to said internal reference voltage node;
   an external terminal;
   a control circuit means;
   first switching means coupled between said internal reference voltage node and a predetermined voltage terminal having a predetermined voltage, and responsive to said control circuit means for supplying said internal reference voltage node with said predetermined voltage;
   second switching means coupled between said internal reference voltage node and said external terminal, and responsive to said control circuit means for supplying said internal reference voltage node with an external voltage applied on said external terminal,
   whereby said control circuit means selectively limits said internal voltage by said first and second switching means in which either said predetermined voltage or said external voltage is selectively applied to said internal reference voltage node; and
   internal voltage providing means coupled to said voltage limiting means for supplying said second electrode with said limited internal voltage as said second voltage.

2. A semiconductor integrated circuit device according to claim 1, wherein said external terminal is used for receiving an input signal and said external terminal is connected with latch means for holding said input signal.

3. A semiconductor integrated circuit device according to claim 2, wherein said nonvolatile storage element is included in an electrically writable and erasable nonvolatile memory cell, said limited internal voltage is used for electrically writing a predetermined information into said memory cell, and said input signal is an output enable signal for controlling data outputting condition.

4. A semiconductor integrated circuit device according to claim 3, wherein said control circuit means generates control signals for controlling said first and second switch means, and said control signals are generated dependent on combinations of external control signals inclusive of said output enable signal.

5. A semiconductor integrated circuit device according to claim 1, wherein said first electrode is a semiconductor region and said second electrode is a gate electrode.

6. A semiconductor integrated circuit device according to claim 5, wherein said voltage generating means includes an oscillator circuit and a voltage generating circuit responsive to output pulses of said oscillator circuit for providing said internal voltage.

7. A semiconductor, integrated circuit device according to claim 5, wherein said control means is coupled to said first and second switching means for controlling said first and second switching means so that said first and second switching means are complementarily operated from each other.

8. A semiconductor integrated circuit device according to claim 7, wherein said voltage generating means includes an oscillator circuit and a voltage generating circuit responsive to output pulses of said oscillator circuit for providing said internal voltage.

9. A semiconductor integrated circuit device according to claim 1, wherein each of said first and second switching means includes a MOSFET.

10. A semiconductor integrated circuit device including a memory element for storing an information and having a plurality of operation modes, comprising:
    internal voltage generating means for generating an internal voltage;
    voltage limiting means comprising a zener diode coupled to said voltage generating means for limiting said internal voltage on the basis of different voltages applied to said voltage limiting means;
    a first external terminal for receiving a first signal;
    a second external terminal;
    control means for selectively limiting said internal voltage by applying to said voltage limiting means either a predetermined internal voltage or an external voltage which is applied to said second external terminal;
    said control means comprising timing signal generating means coupled to said first external terminal, said timing signal generating means generating a first timing signal in response to a change of said first signal from a first level to a second level and generating a second timing signal in response to a change of said first signal from said second level to said first level;
    mode setting means coupled to said second external terminal and including a first holding means for holding information provided from said second external terminal in response to said first timing signal and a second holding means for holding information provided from said second external terminal in response to said second timing signal;
    mode defining means coupled to said mode setting means for selecting one of said operation modes on the basis of the information provided by said first and second holding means; and
    performing means coupled to said mode defining means and for performing said selected operation mode selected by said defining means.

11. A semiconductor integrated circuit device according to claim 6, whereby one of said operation modes provides a mode for simultaneous writing of the same data into all its memory elements.

12. A semiconductor integrated circuit device according to claim 10, wherein said first external terminal receives a write enable signal for controlling writing condition, and said plurality of holding means make latching operations in synchronism with a change in said write enable signal.

13. A semiconductor integrated circuit device according to claim 12, wherein said mode defining means determines the operating conditions dependent on information latched in said plurality of holding means and said write enable signal.

14. A semiconductor integrated circuit device according to claim 12, further comprising a timer circuit for producing timing signals which provide holding timing for said holding means dependent on said write enable signal and said timing signals being outputted after a predetermined period of time has elapsed.

15. A semiconductor integrated circuit device according to claim 14, further comprising an oscillator circuit, and a voltage generating means including a charge pump, and wherein said voltage generating means is caused to perform a charging operation by a clock signal generated by said oscillator circuit and said timer circuit perform a time counting operation by counting the clock signal generated by said oscillator circuit.

16. A semiconductor memory device including a nonvolatile storage element which requires a predetermined write voltage to write data into said nonvolatile storage element, comprising:

voltage generating means for generating an internal voltage;

voltage limiting means comprising a zener diode coupled between said voltage generating means and an internal reference node, said voltage limiting means limiting said internal voltage in accordance with a reference voltage applied on said internal reference node;

an external terminal;

control means for generating a control signal;

external voltage providing means coupled to said external terminal and to said internal reference node, and including means for selectively providing an external voltage applied on said external terminal to said internal reference node; and said selectively providing means comprising switching means coupled to said internal reference node and a predetermined reference voltage terminal which provides a predetermined reference voltage, and said switching means coupled to said internal reference node and said external terminal, and responsive to said control signal from said control means for selectively providing to said internal reference node either said predetermined reference voltage so that said limited internal voltage becomes substantially equal to said predetermined write voltage or said external voltage which allows said limited internal voltage to change to a voltage having a smaller or higher absolute value than that of said predetermined write voltage on the basis of said external voltage.

17. A semiconductor memory device according to claim 16, wherein said switching means includes a switching element having an input node for receiving said predetermined reference voltage, an output node coupled to said internal reference node and a control node for receiving said control signal for controlling a switch operation of said switch element.

18. A semiconductor memory device according to claim 17, wherein said switching element includes a first MOSFET having an electrode coupled to said input node, and an electrode coupled to said output node and a gate electrode coupled to said control node.

19. A semiconductor memory device according to claim 18, wherein said switching means includes a second MOSFET having an electrode coupled to said external terminal, an electrode coupled to said internal reference node and a gate electrode coupled to said control node.

20. A semiconductor memory device according to claim 16, wherein said voltage generating means includes an oscillation circuit and a voltage elevating circuit for generating said internal voltage on the basis of output signals of said oscillation circuit.

21. In a nonvolatile semiconductor memory device having first and second external terminals, a plurality of nonvolatile storage elements, and a plurality of operating modes, mode selection means for generating a mode selection signal, comprising:

internal voltage generating means for generating an internal voltage;

voltage limiting means comprising a zener diode coupled to said voltage generating means for limiting said internal voltage on the basis of different voltages applied to said voltage limiting means;

control means for selectively limiting said internal voltage by applying to said voltage limiting means either a predetermined internal voltage or an external voltage which is applied to said second external terminal;

said control means comprising timing signal generating means coupled to said first external terminal, and including means for generating a first operation signal in response to a change of a control signal applied to said first external terminal from a first level to a second level and means for generating a second operation signal in response to a change of said control signal from said second level to said first level;

first holding means coupled to said second external terminal and responsive to said first operation signal for holding a data applied to said second external terminal in said first holding means;

second holding means coupled to said second external terminal and responsive to said second operation signal for holding a data applied to said second external terminal in said second holding means; and mode select circuit coupled to said first and second holding means and for generating said mode selection signal on the basis of the data held in said first and second holding means.

22. A nonvolatile semiconductor memory device according to claim 21, further comprising selection means for selecting a predetermined nonvolatile storage element from said nonvolatile storage elements, read out means coupled to said selected nonvolatile storage element and for reading out a data from said selected storage element, and an external terminal for receiving said read out data.

23. A nonvolatile semiconductor memory device according to claim 22, further comprising writing means coupled to said selected nonvolatile storage element and responsive to a writing control signal for writing a predetermined data into said selected storage element, wherein said writing control signal is generated in accordance with an external control signal supplied to said first external terminal and an output control signal for controlling said read out means is generated in accordance with an external control signal supplied to said second external terminal.

24. A semiconductor memory device including a plurality of nonvolatile storage elements each of which requires a predetermined voltage to write a data into a nonvolatile storage element, a first external terminal for receiving an external writing control signal and a second external terminal for receiving an external output control signal for controlling output of a stored data in a nonvolatile storage element, said semiconductor memory device comprising:

voltage generating means for generating a first voltage;

voltage limiting means coupled to said voltage generating means and including an internal reference node and means for limiting said first voltage to a limited voltage in accordance with a second voltage applied to said internal reference node;

external voltage providing means coupled to said first external terminal and to said internal reference node, and including means for providing an internal voltage corresponding to an external voltage applied to said second external terminal to said internal reference node;

switching means coupled to said internal reference node and to mode selection means and responsive to a mode selection signal from said mode selection means for providing a reference voltage to said internal reference node so that said limited voltage becomes substantially equal to said predetermined voltage, wherein said switching means allows said limited voltage to change to a voltage having smaller absolute value than that of said predetermined voltage in accordance with said external voltage in a state which said switching means does not provide said reference voltage to said internal reference node; and said mode selection means including:

timing signal generating means coupled to said first external terminal, and including means responsive to a change from a first level to a second level in a control signal to be applied to said first external terminal for generating a first operation signal and means responsive to a change from said second level to said first level in said control signal for generating a second operation signal;

first holding means coupled to said second external terminal and responsive to said first operation signal for holding data applied on said second external terminal;

second holding means coupled to said second external terminal and responsive to said second operations signal for holding data applied on said second external terminal; and mode select circuit coupled to said first and second holding means and for generating said mode selection signal in accordance with the held data in said first and second holding means.

* * * * *